United States Patent [19]
Dreps et al.

[11] Patent Number: 6,014,047
[45] Date of Patent: Jan. 11, 2000

[54] METHOD AND APPARATUS FOR PHASE ROTATION IN A PHASE LOCKED LOOP

[75] Inventors: Daniel Mark Dreps, Georgetown; Robert Paul Masleid; John Stephen Muhich, both of Austin, all of Tex.

[73] Assignee: International Business Machines Corporation, Armonk, N.Y.

[21] Appl. No.: 09/004,133

[22] Filed: Jan. 7, 1998

[51] Int. Cl.⁷ .................................................. H03L 7/06
[52] U.S. Cl. .......................................................... 327/156
[58] Field of Search ...................... 327/141, 142, 327/144–147, 150, 155, 156, 159, 162, 163, 231–237, 244; 331/17; 375/373, 375, 376

[56] References Cited

U.S. PATENT DOCUMENTS

| | | | |
|---|---|---|---|
| 4,489,289 | 12/1984 | Slobodnik et al. | 331/107 A |
| 4,715,049 | 12/1987 | Andrews et al. | 375/106 |
| 4,801,818 | 1/1989 | Schroedinger | 327/165 |
| 4,893,271 | 1/1990 | Davis et al. | 364/900 |
| 4,903,228 | 2/1990 | Gregoire et al. | 364/900 |
| 5,150,078 | 9/1992 | Yang et al. | 331/2 |
| 5,166,952 | 11/1992 | Omurg et al. | 375/1 |
| 5,179,574 | 1/1993 | Watanabe et al. | 375/1 |
| 5,253,268 | 10/1993 | Omura et al. | 375/1 |
| 5,317,284 | 5/1994 | Yang | 331/2 |
| 5,349,310 | 9/1994 | Rieder et al. | 331/18 |
| 5,396,523 | 3/1995 | Hedberg | 375/373 |
| 5,526,380 | 6/1996 | Izzard | 375/375 |
| 5,825,254 | 10/1998 | Lee | 331/25 |
| 5,889,438 | 3/1999 | Yamaguchi | 331/17 |
| 5,889,829 | 3/1999 | Chiao et al. | 375/376 |

FOREIGN PATENT DOCUMENTS 2128824  5/1984  Germany.

OTHER PUBLICATIONS

Digital Technical Journal, "Circuit Implementation of a 300—MHz 64–bit Second–generation CMOS Alpha CPU", vol. 7, No. 1, 1995, pp. 100–115.

Primary Examiner—My-Trang Nuton
Attorney, Agent, or Firm—Anthony V.S. England

[57] ABSTRACT

Among a plurality of signals, each phase-shifted with respect to the others, one signal is repeatedly substituted for another as a clock signal, to reduce a phase error of the clock signal with respect to a reference clock. The substitutions are timed to occur during intervals tending to reduce disturbances to the clock signal. Also, such substitution of a signal is responsive to occurrence of at least one cycle of the signal subsequent to the clock being supplied by an immediate predecessor of the signal, which tends to prevent erroneous substitutions of one signal for another.

8 Claims, 5 Drawing Sheets

METHOD AND APPARATUS FOR PHASE ROTATION IN A PHASE LOCKED LOOP

CROSS REFERENCE TO RELATED PATENT APPLICATIONS

This application is related to the following co-pending applications, assigned to the assignee of this application, and which are hereby incorporated herein by reference:

High Speed Differential CMOS Sine-Wave Receiver with Duty Cycle Control Means, having filing date Apr. 18, 1997 and Ser. No. 844504;

A Clock Generation Apparatus and Method for CMOS Microprocessors Using a Differential SAW Oscillator, having filing date Oct. 31, 1996 and Ser. No. 742220; and Method and Apparatus for Coupled Phase Locked Loops, filed on even date herewith Ser. No. 09/004,136.

BACKGROUND

1. Technical Field

The present invention relates to phase locked loops, and more particularly to selective phase rotation in a phase locked loop used for clock generation, such as for clocks in microelectronic circuitry.

2. Description of the Related Art

Phase locked loops ("PLL's") are useful for generating clock signals, such as for clocks used in microelectronic circuitry, including microprocessors. However, conventional PLL's are susceptible to noise. Furthermore, power supplies, particularly for microprocessors, can be very noisy, resulting in unacceptable jitter in the output signal of a PLL. This jitter is even more problematic for the multi-phase clocks used in microprocessors.

A method and apparatus useful for generating a clock signal, which is less susceptible to noise than conventional PLL's, has been disclosed in one or more of the above referenced patent applications, according to which a set of signals are generated having a predetermined phase relation to one another. The clock is sourced by a signal successively switched from one of the signals in the set to another (i.e., "rotated"), with the effect that the clock source signal is phase rotated. In this context, at least, there is needed a method and apparatus for selective phase rotation of a signal in a phase locked loop.

SUMMARY OF THE INVENTION

The foregoing needs are met in the present invention, which is summarized as follows. In a first form, the invention encompasses a method for supplying a clock signal. A first signal is supplied from among a plurality of signals, for a clock signal. A second, signal, phase-shifted with respect to the first signal, is substituted for the first signal, from among the plurality of signals, responsive to i) a phase difference between the clock signal and a reference clock signal, and ii) occurence of an interval when the first and second signal are quiescent.

In an additional aspect, the substituting of the second signal is also responsive to occurence of at least one cycle of the second signal after the first signal is supplied for the clock signal.

In yet another aspect, a third signal, phase-shifted with respect to the second signal, is substituted for the second signal, from among the plurality of signals, responsive to i) a phase difference between the clock signal and a reference clock signal, and ii) occurence of an interval when the second and third signal are quiescent.

In a further aspect, the substituting of the third signal is also responsive to occurence of at least one cycle of the third signal after the second signal is substituted for the first signal.

In another form, the invention encompasses an apparatus for supplying a clock signal. The apparatus includes means for supplying, from among a plurality of signals, a first signal for a clock signal, and means for substituting, for the first signal, a second, phase-shifted signal from among the plurality, responsive to i) a phase difference between the clock signal and a reference clock signal, and ii) occurence of an interval when the first and second signal are quiescent.

Additionally, in another aspect, the means for substituting is further responsive to occurence of at least one cycle of the second signal after supplying the first signal for the clock signal.

In yet another aspect, the apparatus includes means for substituting a third signal, phase-shifted with respect to the second signal, for the second signal, from among the plurality of signals, responsive to i) a phase difference between the clock signal and the reference clock signal, and ii) occurence of an interval when the second and third signal are quiescent.

In a further aspect, the means for substituting the third signal is also responsive to occurence of at least one cycle of the third signal after the second signal is substituted for the first signal.

It is an advantage of the invention that the substituting of one phase-shifted signal for another reduces a phase error of the clock signal with respect to the reference clock, while conditioning the substitutions on occurence of the above described quiescent intervals tends to reduce disturbances to the clock signal arising from the substitution of one signal for another. Also, making the substitution of a signal for supplying the clock responsive to occurrence of at least one cycle of the signal subsequent to supplying the clock by an immediate predecessor of the signal, tends to prevent erroneous substitutions of one signal for another.

BRIEF DESCRIPTION OF THE DRAWINGS

FIG. 7 shows logic elements of the filter 22 of FIG. 1.

DETAILED DESCRIPTION

Figure 1:
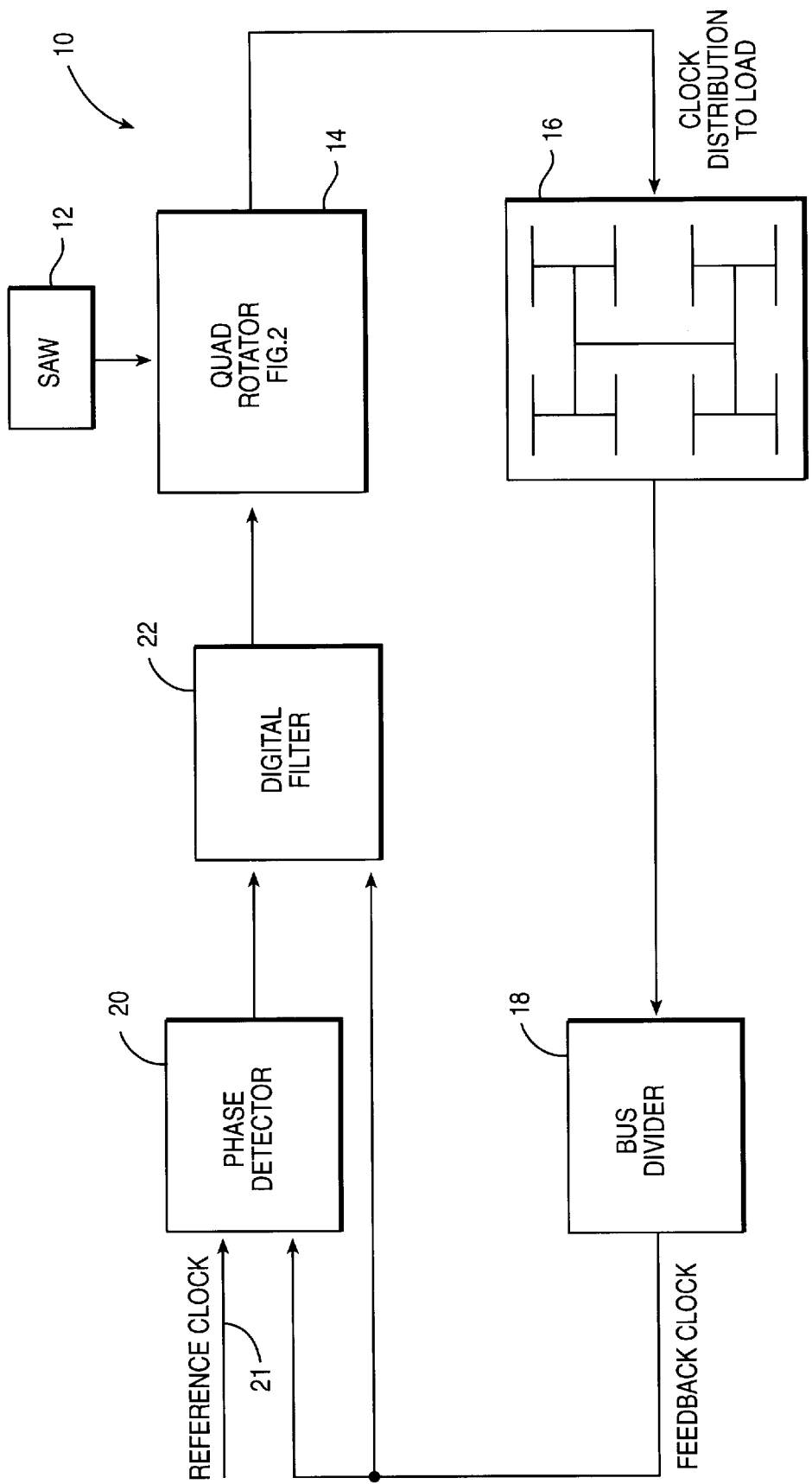
FIG. 1 is a high level block diagram of a clock system using phase rotation in accordance with an embodiment of the present invention.

Referring now to FIG. 1, a preferred embodiment of the present invention is illustrated. Clock system 10 receives an externally generated reference clock signal 21, generates a relatively higher frequency first clock signal, which is output by rotator 14, and phase locks the first clock signal to the reference clock.

The reference clock, in the example of FIG. 1, is a 200 MHz signal. The first clock is derived from a signal generated by signal generator 12, preferably a surface acoustic wave ("SAW") oscillator, at a relatively much higher 800.4

MHz frequency. The rotator 14 in the embodiment shown outputs one 400.2 MHz signal, as the first clock, selected from among four source signals internal to the rotator 14 which are respectively 0, 90, 180 and 270 degrees lagging the 800.4 MHz signal from the SAW oscillator 12. The first clock signal is distributed to loads as illustrated by block 16.

The first clock signal is also reduced in frequency by divider 18 (the reduced frequency first clock signal being referred to as the "feedback clock" signal), and input to phase detector 20, and digital filter 22. In this embodiment, the divider 18 divides by two.

The phase detector 20 compares the reference clock and the first clock and generates one or more signals indicating the phase difference. Such phase detectors 20 are well known, and therefore will not be described further herein. See, for example, Wyatt et al., U.S. Pat. No. 5,546,052, "Phase Detector with No Phase Error."

The indication of phase difference is fed back, through digital filter 22, to the rotator 14.

It should be appreciated, from the above, that with the SAW oscillator 12 frequency of 800.4 MHz and dividing by two in the rotator 14 and the divider 18, the feedback clock has a frequency of 200.1 MHz. Thus, both the feedback clock, and the first clock, i.e., the source for the feedback clock, consistently gain in leading phase difference with respect to the reference clock. Therefore, rotator 14 must regularly adjust the first clock signal by successively changing the selected source for the first clock from one of the source signals to another, lagging one of the source signals in order to phase lock the feedback clock (and thus the first clock) to the reference clock.

Figure 2:
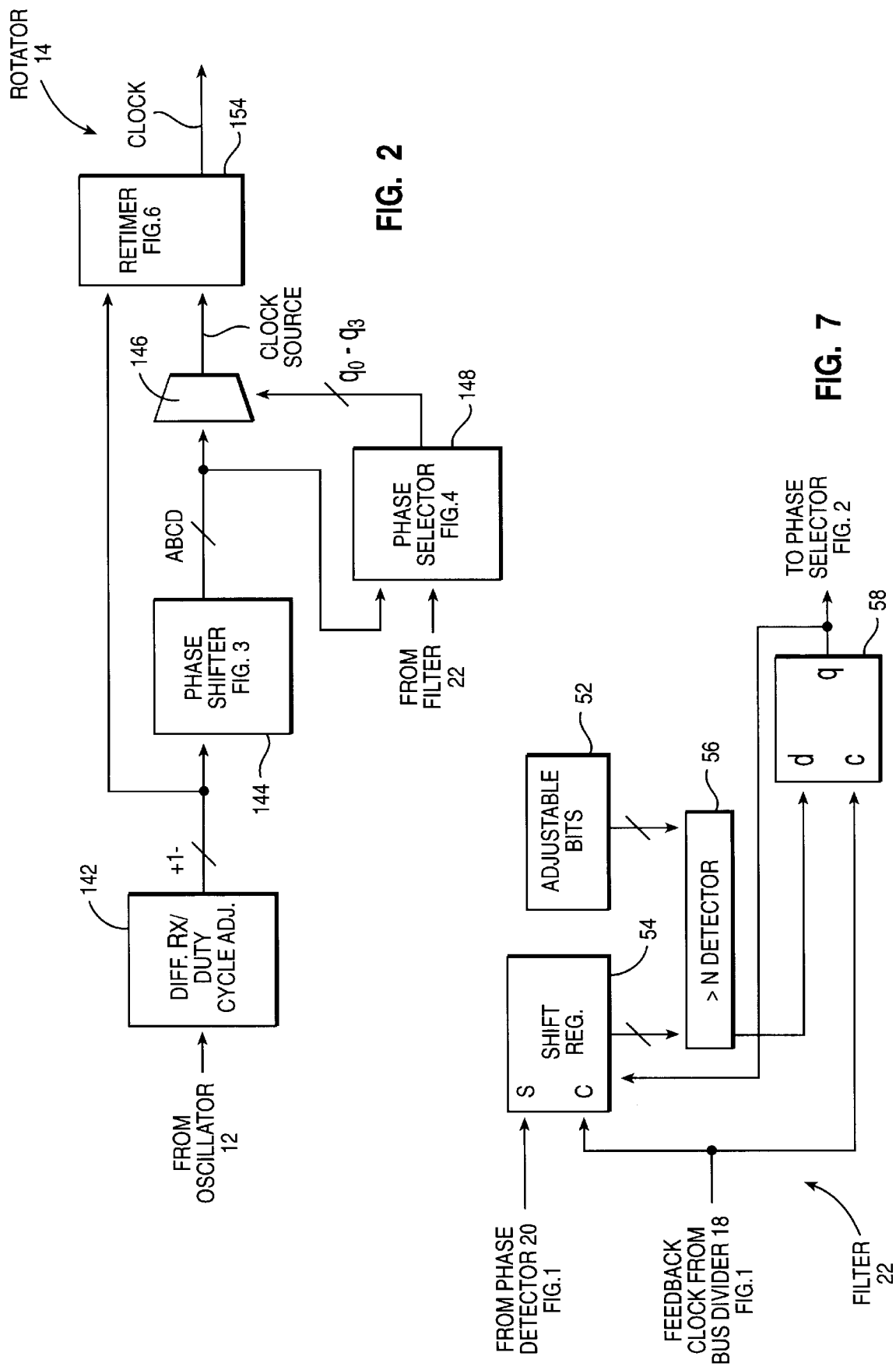
FIG. 2 is a block diagram of the rotator 14 of FIG. 1.

Referring now to FIG. 2, logic elements of the FIG. 1 rotator 14 are now described.

The differential oscillator 12 signal is received by rotator 14 in a differential receiver/duty cycle adjuster 142, which applies bias to the appropriate side of a differential receiver load stage to compensate for input imbalance. Details of such a differential receiver/duty cycle adjuster 142 are described in one or more of the above referenced, related applications, and therefore will not be described further herein.

The oscillator 12 signal, as modified by device 142, is next fed to phase shifter 144, which generates a set of signals, A, B, C, and D, which have one-half the frequency of the oscillator 12 signal, wherein signal B lags signal A by 90 degrees, signal C lags signal B by 90 degrees, and signal D lags signal C by 90 degrees. (In one or more of the above referenced, earlier filed, related applications the phase shifter 144 is referred to as a "rotator", although it is an element within rotator 14.)

These four quadrature signals, A, B, C and D, are fed to phase selector 148 and multiplexer 146. (In one or more of the above referenced, earlier filed, related applications the phase selector is referred to as "shift logic.") Phase selector 148 successively selects one of the four signals, A, B, C or D, as the source for the clock signal, which is output from the rotator 14. This selecting is done by asserting a signal on one of the output lines, q0, q1, q2 or q3, from the phase selector 148 to multiplexer 146. Since multiplexers are well known for outputing a selected signal from among a number of signals input to such a multiplexer, details of multiplexer 146 are not described further herein.

The signal output from multiplexer 146 optionally is output directly as the clock signal, or it may first be retimed by optionally provided retimer 154, depending on whether retiming is required for reducing skew.

Figure 3:
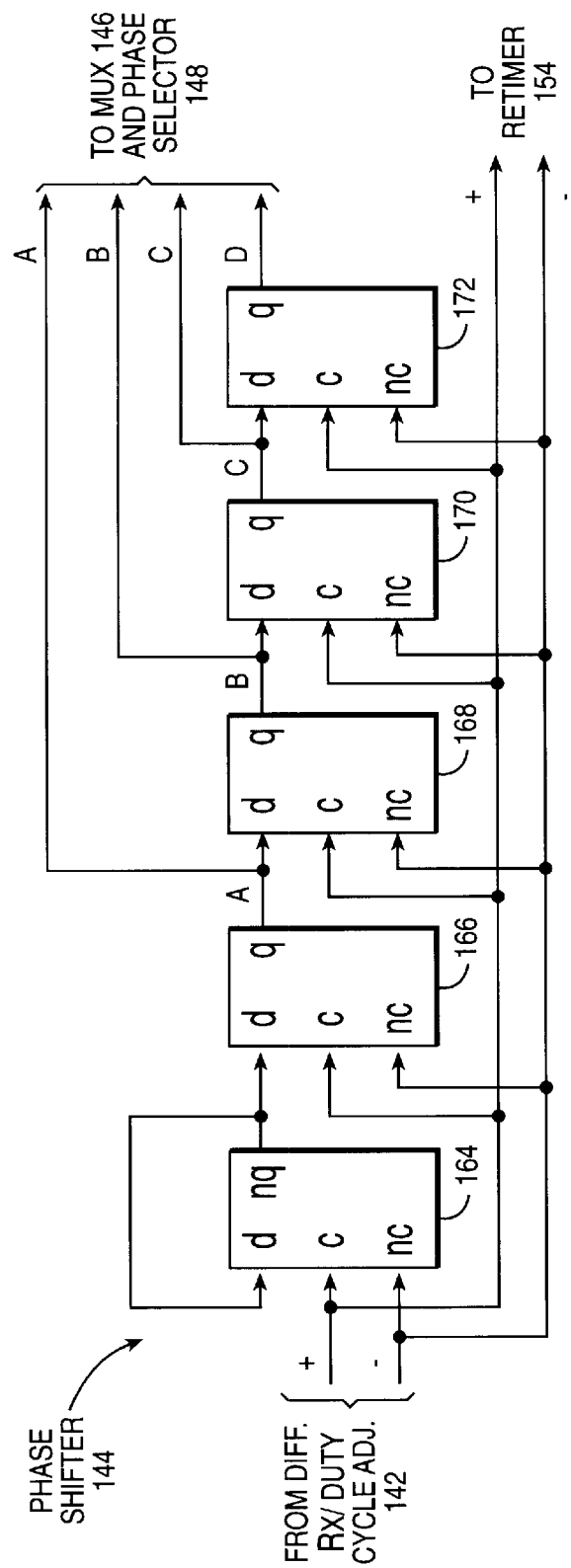
FIG. 3 shows logic elements of the FIG. 2 phase shifter 144.

Referring now to FIG. 3, additional details of the phase shifter 144 are now described. Shifter 144 has five delay flip-flops 164, 166, 168, 170 and 172. The NOT output of flip-flop 164 is fed back to its own logic input and fed into the logic input of flip-flop 166. The output of flip-flop 166 is fed into the input of flip-flop 168. The output of flip-flop 168 is fed into the input of flip-flop 170. The output of flip-flop 170 is fed to the input of flip-flop 172. The clock inputs of the flip-flops each receive the duty cycle adjusted, oscillator signal.

With its NOT output fed back to its input, flip-flop 164 acts to divide the frequency of the oscillator 12 input signal by two. It should be appreciated that, alternatively, flip-flop 164 could be omitted if it were desired for the first clock to be at the same frequency as the oscillator 12 signal. Due to the series connection of inputs to outputs for flip-flops 166–172, the output, A, of flip-flop 166 leads by 90 degrees the output, B, of flip-flop 168. Likewise, B leads the output, C, of flip-flop 170, and so on. It should be appreciated that, clock jitter is substantially improved, in comparison with conventional PLL's, according to this embodiment wherein the clock source rotates among quadrature signals. Further reduction in phase error between the reference clock and feedback clock may be achieved, at the expense of some additional complication, by including additional elements in phase shifter 144 to generate some number of signals greater than the four signals of the present embodiment.

Figure 4:
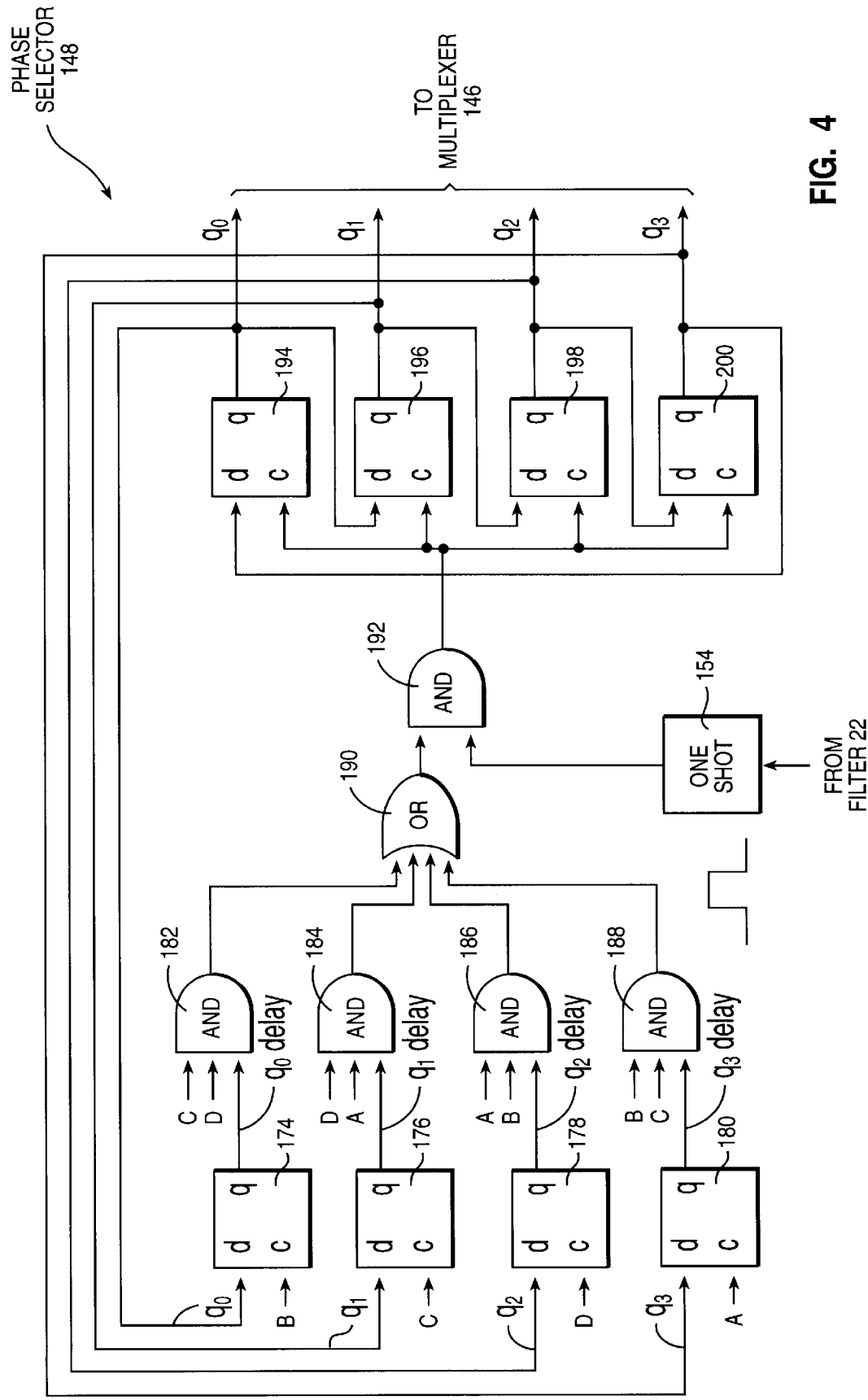
FIG. 4 shows logic elements of the FIG. 2 phase selector 148.

Referring now to FIG. 4, additional details of the phase selector 148 are now described. Delay flip-flops 174, 176, 178 and 180 receive, at their clock inputs, signals B, C, D and A respectively, from phase shifter 144. These flip-flops also receive, as logic inputs, outputs from respective delay flip-flops 194, 196, 198 and 200. The outputs from delay flip-flops 174–180 are fed to respective AND gates 182, 184, 186 and 188. The AND gates also receive the following signals from phase shifter 144 as inputs, respectively, C and D to AND gate 182, D and A to AND gate 184, A and B to AND gate 186, and B and C to AND gate 188. The outputs from the AND gates are input to OR gate 190. The OR gate 190 output is fed to AND gate 192, which also receives an input from a single shot 152.

The single shot is triggered by a signal from the filter 22, indicating that the phase difference between the reference clock and the feedback clock is sufficiently large as to demand correction—that is, indicating that the feedback clock leads the reference clock by a predetermined amount (the "threshold" amount).

The output of the AND gate 192 is fed to the clock inputs of delay flip-flops 194 through 200. In addition to being fed back to flip-flops 174–180, the outputs, q0, q1, q2 and q3, of flip-flops 194 through 200 are fed to the multiplexer 146 for selecting one of the signals A, B, C or D, from the phase shifter 144.

The outputs q0–q3 of flip-flops 194–200 are initialized by reset lines (not shown) so that initially q0=1, and q1, q2, and q3=0. Thus, with the flip-flops 194–200 connected as described, each time the signal to the flip-flop clock inputs is pulsed the next output in sequence goes hi, and the previously hi output goes low, while the remaining outputs stay low. That is, after the first pulse following initialization, q1 goes hi and q0 goes low, while q2 and q3 remain low. After the next pulse, q2 goes high and q1 goes low, while q0 and q3 remain low, and so on. This progression of switching one output high at a time in sequential order may also be referred to as "rotating."

The flip-flops 174–180, AND gates 182–188, OR gate 190 and AND gate 192 serve to control the timing of the rotating within the span of a selected cycle, so that the outputs q0–q3 rotate during the "last quarter" of the selected cycle. In this context, a cycle for a signal is considered to begin when the signal goes high, so that the "last quarter" of a signal's cycle refers to the quarter of the cycle when the signal is low (i.e., quiescent), immediately preceding the next rise in the signal. That is, according to the present embodiment, if signal A, from phase shifter 144, is sourcing the clock, the timing of a rotation from signal A to signal B is controlled to occur during the last quarter of signal A's cycle. The reason for rotating during the last quarter of signal A's cycle, for a rotation from signal A to signal B, is because both signal A and signal B are low (i.e., quiescent) during the last quarter of signal A's cycle, since signal B lags signal A by 90 degrees. Likewise, if signal B is sourcing the clock, the timing of a rotation from signal B to signal C is controlled to occur during the last quarter of cycle B, and so on.

Figure 5:
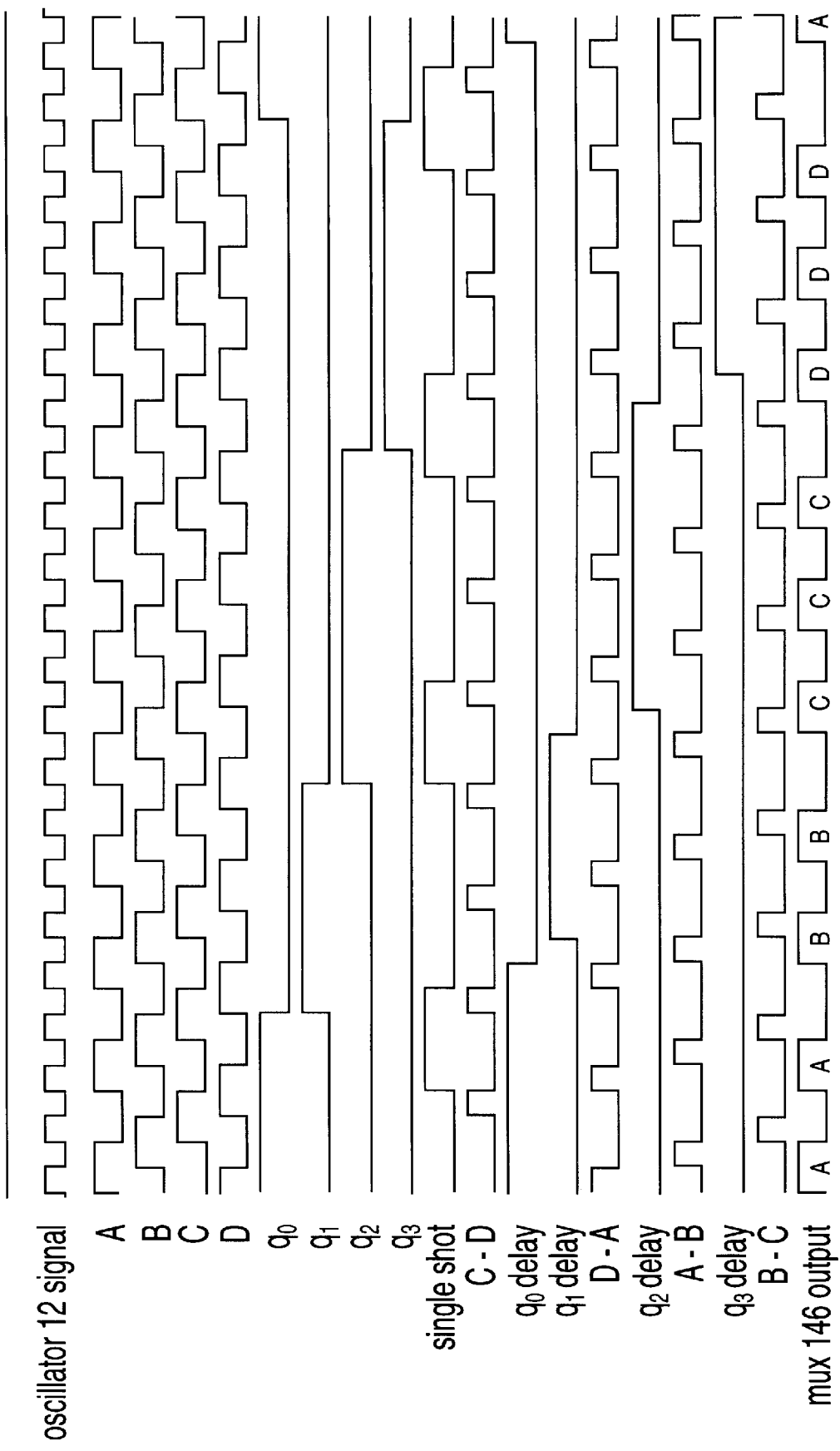
FIG. 5 is a timing diagram illustrating aspects of the embodiment's operation.

The operation of flip-flops 174–180, AND gates 182 188, OR gate 190 and AND gate 192, to control the timing of the rotating within the span of a selected cycle, may be understood by considering the particular logical combinations of signals shown in FIG. 4, and the timing of the signals shown in FIG. 5. Consider the timing of a rotation, for example, from signal C to signal D.

Prior to the third assertion of single shot signal in FIG. 5, signal C is the multiplexer 146 output signal for the clock source. The signal from digital filter 22 which triggers the single shot 154 is responsive to the phase difference detected by phase detector 20. Thus, the third assertion of the single shot signal in FIG. 5 indicates that the phase error between the reference clock and the clock now sourced by signal C has exceeded the predetermined threshold phase error, and therefore a rotation to signal D is needed to reduce the phase error.

In the idealized example, single shot 154 signals are shown being asserted at regular intervals. The regularity of the intervals arises because of the substantially fixed difference in frequency of the quadrature signals, with respect to the reference clock, as previously described.

Although rotation is now called for, as indicated by the assertion of the single shot signal, the rotation must be timed to avoid glitches in the resultant clock signal. At the instant when the third instance of the single shot signal occurs in FIG. 5, signal C is falling, but signal D is still asserted. Thus, a rotation at this instant would not correspond to a time when both signals C and D are low, and consequently such a rotation would tend to introduce a disturbance to the clock signal. The phase selector 148 of FIG. 4, therefore, includes logic to select the timing of the rotation responsive not only to the one shot signal, but also to the state of the clock. The flip-flops 174–180, AND gates 182–188, and OR gate 190 provide logic for this timing of the rotation responsively to the clock state, as is now described. Immediately preceding the one shot signal calling for the rotation from signal C to signal D, the select signal q2 is asserted, and signals q0, q1 and q3 are not. (This is logical, of course, since it is the assertion of q2 that controls the selection by multiplexer 146 of signal C as the clock source.) In response to the assertion of q2 and one subsequent assertion of signal D, flip-flop 178 asserts its output, which is an input to AND gate 186. The single shot signal assertion has a one cycle duration. The delay introduced by flip-flops 174–180, with their respective signal B, C, D and A inputs, plus the one cycle duration of the single shot assertion, combine to prevent an erroneous second rotation of the quadrature signals in response to a one shot signal intended to generate only a single rotation.

Upon the assertion of the flip-flop 178 output, none of the other flip-flops 174, 176 or 180 have their outputs asserted,
since signals q0, q1, and q3 have, at that time, not been asserted for at least one cycle. Consequently, among AND gates 182–188, only AND gate 186 can possibly assert an output signal for the present duration of signal q2's assertion. The two other inputs to AND gate 186 are signals A and B. Due to the phase relations of the quadrature signal, signals A and B are asserted concurrently only during the final quarter of the signal C cycle. Thus, AND gate 186 is satisfied only when the proper delay has occurred to prevent erroneous double rotation, as controlled by flip-flop 178, and when signal C is in the final quarter of one of its cycles, as indicated by signals A and B.

Once AND gate 186 is satisfied, and asserts its output, OR gate 190 responsively asserts its output. In response to the output signal from OR gate 190, the single shot 154 signal both being asserted, AND gate 192 asserts its output, which triggers flip-flop 200 to assert its output q3 and flip-flop 198 to de-assert its output q2. In response to q3 being asserted, multiplexer 146 switches its output signal, for sourcing the clock, from signal C to signal D.

This detailed description of a rotation from signal C to signal D illustrates how flip-flops 174–180, AND gates 182–188, OR gate 190 and AND gate 192, cooperate with the phase shifter 144 to control the timing of the rotating within the span of a selected cycle. It should be understood from the above example and the FIG's how the timing of rotations from signal A to signal B, signal B to signal C, and signal D to signal A is likewise controlled.

Figure 6:
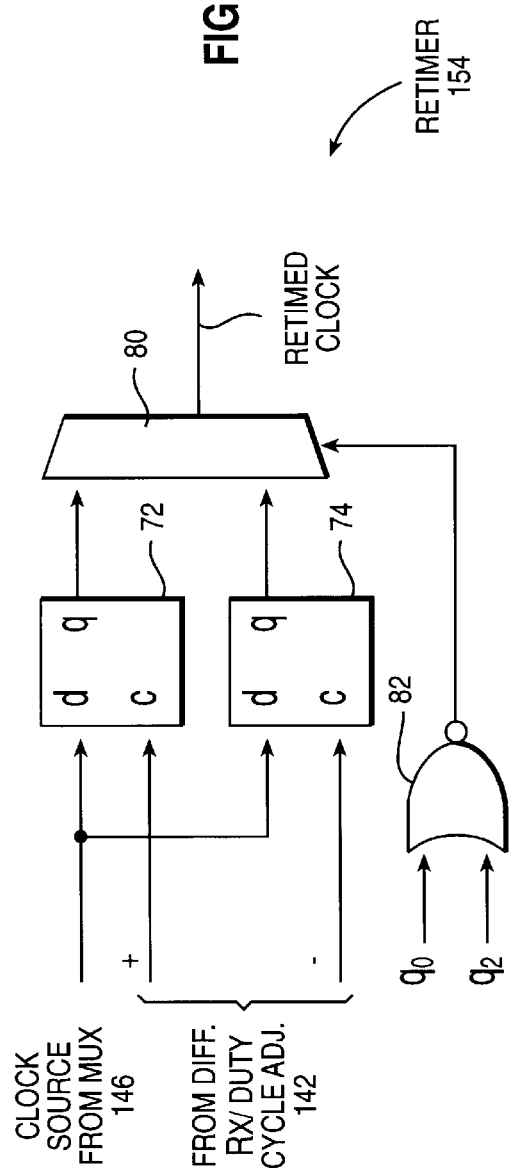
FIG. 6 shows logic elements of the FIG. 2 retimer 154.

Referring now to FIG. 6, additional details of the retimer 154 are now described. (The term "retimer" is used to refer to the function of reducing a slight skew in the clock signal output by multiplexer 146 which may have been introduced in the ordinary course of gating by various circuit elements in the rotator 14.) The selected signal from multiplexer 146, which is the source for the first clock, is input to the delay input of delay flip-flops 72 and 74. One signal from oscillator 12, at double the frequency of the clock signal output from multiplexer 146, is fed to the flip-flop 72 clock input, while the other oscillator 12 signal, 180 degrees out of phase from the first, is fed to the flip-flop 74 clock input. The q0 and q3 signals from phase selector 146 are used to select either the output from flip-flop 72 or flip-flop 74 for use as the clock signal. That is, q0 and q3 are input to NOR gate 82, and the NOR gate output is fed to multiplexer 80, so that when q0 or q3 is asserted the output from flip-flop 74 is output by multiplexer 80, and when neither q0 nor q3 are asserted the output from flip-flop 72 is output by the multiplexer 80.

Reasons for the configuration of retimer 154 may be understood with reference to the timing diagram of FIG. 5, which shows idealized timing of various signals. From the FIG., it may be seen that when the multiplexer 146 output signal, shown at the bottom of the timing diagram, is supplied by signals A and C from phase shifter 144, the mid-point of the pulses output by the multiplexer 146 ideally correspond to the falling edge of the oscillator 12 rising signal, shown at the top of the timing diagram. Likewise, when the multiplexer 146 output signal is supplied by signals B and D from phase shifter 144, the mid-point of the pulses output by the multiplexer 146 correspond to the rising edge of the oscillator 12 signal. Therefore, the retiming by a delay flip-flop of the multiplexer 146 output signal must be clocked by the falling edge of the oscillator 12 signal when the multiplexer 146 output is supplied by signals A and C, but must be clocked by the rising edge of the oscillator 12 signal when the multiplexer 146 output is supplied by signals B and D.

Furthermore, when signal q0 is asserted, signal A is output by the multiplexer 146. When signal q2 is asserted, signal C is output by multiplexer 146. Thus, when neither q0 nor q2 are asserted, signal B or signal D is output. Therefore, signals q0 and q2 may be used in the retimer 154, as shown, to control the selection by multiplexer 80 of the output signals from flip-flops 72 and 74.

Details of the digital filter 22, configured as shown in FIG. 7, are now described. It should be appreciated that the embodiment contemplates that the clock generating system 10 of FIG. 1, except for the oscillator 12, may be included on the same die with a microprocessor. With respect to the filter 22, a register 52 is provided for setting of bits thereon by control circuitry (not shown) after manufacture of the die. The number of bits in the register 52 thus asserted determines the tuning of the filter 22, as the following will explain.

Shift register 54 has a data input (not shown) which is constantly asserted. When the phase detector 20 of FIG. 1 detects that the feedback clock leads the reference clock, the phase detector 20 asserts a signal to the shift register 54. The shift register 54 is initialized with all bits reset. For each cycle of the feedback clock having the phase detector 20 signal asserted, the shift register 54 shifts the constantly asserted input data bit. Thus, when the feedback clock leads the reference clock, and time passes, the shift register 54 accumulates an increasing number of asserted bits.

N detector 56, being coupled to the shift register 54 and the adjustable bits register 52, detects the number of bits asserted in the shift register 54 and in the adjustable bits register 52. When the number of bits asserted in the shift register 54 exceed the number asserted in the adjustable bits register 52, the N detector 56 asserts a signal coupled to flip-flop 58. After one feedback clock cycle, the flip-flop 58 asserts its output signal in response to the signal from the N detector 56 being asserted. The flip-flop 58 output signal is fed back to the shift register 54 to reset all its bits. Thus, the N detector 56 output signal resets, and in one more cycle of the feedback clock, the flip-flop 58 output resets.

The flip-flop 58 output signal is also fed to the single shot of phase selector 148, shown in FIG. 4. Thus, when the flip-flop 58 output signal is asserted for the single cycle of the feedback clock, this triggers the phase selector 148 one shot to initiate a rotation by rotator 14.

The method and apparatus of the present invention has been disclosed in connection with a preferred embodiment. Many other varied embodiments that incorporate the teachings of the disclosure may be constructed by those skilled in the art. Accordingly, the invention should not be limited to the specific form set forth herein. On the contrary, the invention is intended to cover such alternatives, modifications, and equivalents of the teachings of this disclosure as can be reasonably included within the spirit and scope of the invention as claimed hereinbelow.

What is claimed is:

1. A method for supplying a clock signal, comprising the steps of:
 a) receiving, by a rotator, a frequency bearing signal from an oscillator;
 b) generating, by the rotator in response to the received frequency bearing signal, a concurrent plurality of frequency bearing signals, wherein the concurrent plurality have a same frequency, but are phase shifted with respect to one another;
 c) supplying as the clock signal, by the rotator, a first one of the generated signals from among the concurrent plurality of generated signals;
 d) communicating to the rotator, from a phase detector, a magnitude of phase difference between the supplied clock signal and a reference clock signal;
 e) selecting, by the rotator, from among the concurrent plurality of generated signals, a second one of the generated signals, the second selected one of the generated signals being phase-shifted with respect to the first selected one of the generated signals, wherein the selecting of the second selected one of the generated signals is responsive to the magnitude of the phase difference communicated from the phase detector; and
 f) supplying as the clock signal, by the rotator, the second selected one of the generated signals, in substitution for the first selected one of the generated signals, in order to reduce the magnitude of the phase difference, wherein the supplying of the second selected one of the generated signals in substitution for the first selected one of the generated signals is responsive to occurrence of an interval when the first and second selected ones of the generated signals are quiescent, in order to reduce disturbance associated with the substituting of the second selected one of the generated signals for the first selected one of the generated signals.

2. The method of claim 1, wherein the supplying of the second one of the generated signals by the rotator, from among the plurality of generated signals, is also responsive to occurrence of at least one cycle of the second one of the generated signals after the first selected one of the generated signals is supplied by the rotator.

3. The method of claim 2, comprising the steps of:
 g) selecting, by the rotator, from among the concurrent plurality of generated signals, a third one of the generated signals, the third selected one of the generated signals being phase-shifted with respect to the second selected one of the generated signals, wherein the selecting of the third selected one of the generated signals is responsive to the magnitude of the phase difference communicated from the phase detector; and
 h) supplying the third selected one of the signals as the clock signal, by the rotator, in order to reduce the magnitude of the phase difference, wherein the supplying of the third selected one of the generated signals is responsive to occurrence of an interval when the second and third selected ones of the generated signals are quiescent.

4. The method of claim 3, wherein the supplying of the third one of the generated signals by the rotator, from among the plurality of generated signals, is also responsive to occurrence, of at least one cycle of the third one of the generated signals after the second selected one of the generated signals is supplied by the rotator.

5. An apparatus for supplying a clock signal, comprising:
 an oscillator for generating a frequency bearing signal;
 a rotator for receiving the frequency bearing signal from the oscillator and responsively generating a plurality of frequency bearing signals, all of the plurality having a same frequency, but being phase shifted with respect to one another, and for supplying as the clock signal, a first one of the generated signals from among the plurality of generated signals; and
 a phase detector for receiving a reference clock signal and the supplied clock signal, and responsively communicating to the rotator an error signal indicating magnitude of phase difference between the supplied clock and reference clock signals, wherein the rotator is further operable to select from among the plurality of generated signals, a second one of the generated signals, the second selected one of the generated signals being phase-shifted with respect to the first selected one of the generated signals, the selecting of the second selected one of the generated signals being responsive to the magnitude of the phase difference communicated from the phase detector, and to occurrence of an interval when the first and second selected ones of the generated signals are quiescent, and wherein the rotator is further operable to supply as the clock signal the second selected one of the generated signals, in substitution for the first selected one of the generated signals, so that the substitution of the second selected one of the generated signals for the first selected one of the generated signals reduces the magnitude of the phase difference.

6. The apparatus of claim 5, wherein the selection of the second one of the generated signals by the rotator, from among the plurality of generated signals, is further responsive to occurrence of at least one cycle of the second one of the generated signals after the first selected one of the generated signals is supplied by the rotator.

7. The apparatus of claim 6, wherein the rotator is further operable to select, from among the plurality of generated signals, a third one of the generated signals, the third selected one of the generated signals being phase-shifted with respect to the second selected one of the generated signals, wherein the selecting of the third selected one of the generated signals is responsive to the magnitude of the phase difference communicated from the phase detector, and to occurrence of an interval when the second and third selected ones of the generated signals are quiescent, and is further operable to supply the third selected one of the signals as the clock signal, so that the supplying of the third selected one of the signals as the clock signal reduces the magnitude of the phase difference.

8. The apparatus of claim 7, wherein the selecting of the third one of the generated signals by the rotator, from among the plurality of generated signals, is also responsive to occurrence, of at least one cycle of the third one of the generated signals after the second selected one of the generated signals is supplied by the rotator.

* * * * *